United States Patent [19]
Lovelace et al.

[11] Patent Number: 6,133,797
[45] Date of Patent: Oct. 17, 2000

[54] SELF CALIBRATING VCO CORRECTION CIRCUIT AND METHOD OF OPERATION

[75] Inventors: David K. Lovelace; Jeffrey C. Durec, both of Chandler; Mike McGinn, Tempe; Klaas Wortel, Phoenix, all of Ariz.

[73] Assignee: Motorola, Inc., Schaumburg, Ill.

[21] Appl. No.: 09/363,221

[22] Filed: Jul. 30, 1999

[51] Int. Cl.[7] ...................................................... H03L 7/00
[52] U.S. Cl. ................................. 331/17; 331/25; 327/12
[58] Field of Search ................................ 331/17, 25, 1 A, 331/27; 327/12, 157

[56] References Cited

U.S. PATENT DOCUMENTS

| | | | |
|---|---|---|---|
| 5,410,571 | 4/1995 | Yonekawa et al. | 375/376 |
| 5,592,110 | 1/1997 | Noguchi | 327/12 |
| 5,648,744 | 7/1997 | Frakash et al. | 331/11 |
| 5,870,002 | 2/1999 | Ghaderi et al. | 331/17 |
| 5,896,066 | 4/1999 | Katayama et al. | 331/17 |

OTHER PUBLICATIONS

Frequency Synthesizer Design Handbook, James A. Crawford, pp. 18 and 22, Aug. 1994.

Primary Examiner—Robert Pascal
Assistant Examiner—Henry Choe
Attorney, Agent, or Firm—Lanny L. Parker

[57] ABSTRACT

A PLL system (10) includes a PFD (24) that receives a reference clock signal (REF CLK) and a feedback clock signal (FBK CLK). The PFD (24) generates an analog signal (TUNE) based on the phase and frequency relationship of the reference and feedback clock signals. The PFD (24) also generates a clock signal based on two PI phase slips for clocking a counter (70). The analog signal is compared against an upper and lower reference voltage in a threshold detect circuit (34) and the signals UP and DOWN supplied to the counter (70). The counter (70) provides a count value that controls the resonant frequency generated by a tank circuit (73). The tuning range of an oscillator (18) is extended by changing the capacitance of the tank circuit (73).

15 Claims, 3 Drawing Sheets

SELF CALIBRATING VCO CORRECTION CIRCUIT AND METHOD OF OPERATION

BACKGROUND OF THE INVENTION

The present invention relates, in general, to Phase-Locked Loop (PLL) devices and, more particularly, to the tuning of a Voltage-Controlled Oscillator (VCO) in a PLL.

Phase-Locked Loops (PLLs) are widely used for clock generation or synchronization in data local area networks, data storage applications, disc drives, microprocessors, and communication systems. The PLL in communication systems and computer systems generally includes a phase detector, a loop filter, a Voltage-Controlled Oscillator (VCO), and a loop frequency divider. The phase detector receives a reference clock signal and a loop clock signal and provides a phase detect output signal that indicates the phase difference between the loop clock signal and the reference clock signal. The phase detect output signal is transferred to an input of the loop filter for generating a filtered signal to the VCO. The filtered signal provides a voltage to the VCO that adjusts the phase and frequency of the clock output signal. The clock output signal is typically scaled to a lower frequency by the loop frequency divider in generating the loop clock signal for the phase detector.

When the loop clock signal is synchronized to the reference clock signal, these two signals have the desired phase-frequency relationship and the PLL is locked. If the loop clock signal and the reference clock signal are out of phase, the voltage generated by the phase detector is supplied to the VCO for changing the capacitance value of a tank circuit and the resonant frequency at which the tank circuit oscillates. The dynamic adjustments to the voltage supplied to the VCO correct the frequency of the clock output signal to regain phase and frequency lock.

Typically, the capacitive and inductive components associated with the tank circuit vary over a range of values and component trimming is required to achieve the desired tuning of the VCO. Whether the capacitive and inductive components are integrated or discrete components, component tolerances are compensated through trimming which allows the voltage supplied by the phase detector a tuning range that is sufficient for the VCO to achieve phase lock for the PLL. The trimming adjusts the capacitive and/or inductive components to center the oscillator frequency. A limited operating supply voltage also limits the tuning range and necessitates component trimming, increasing the manufacturing cost due to additional steps and testing.

Accordingly, it would be advantageous to have a PLL device and a method for improving the tuning range of the VCO without trimming the capacitive and inductive components associated with the tank circuit. It would be of further advantage to have a PLL that minimizes the amount of time it takes to attain phase lock when the PLL device receives a reference clock signal.

DETAILED DESCRIPTION OF THE DRAWINGS

Figure 1:
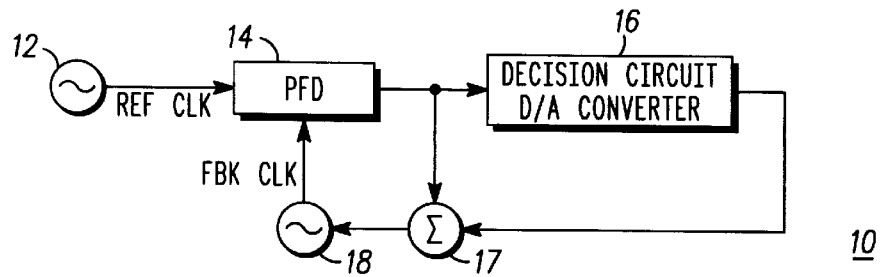
FIG. 1 is a block diagram of a phase-locked loop system.

FIG. 1 is a block diagram of a Phase-Locked Loop (PLL) system 10. PLL system 10 includes a Phase-Frequency Detector (PFD) 14. PFD 14 receives a reference clock signal from an oscillator 12 and another clock signal from an oscillator 18. PFD 14 has an output terminal that is commonly connected to an input terminal of a decision circuit 16 and to a first input of summing circuit 17. An output terminal of decision circuit 16 is connected to a second input of summing circuit 17. An output terminal of summing circuit 17 is connected to an input of oscillator 18. For the sake of simplicity, a loop filter that filters the signal at the output of PFD 14 is not shown.

Figure 2:
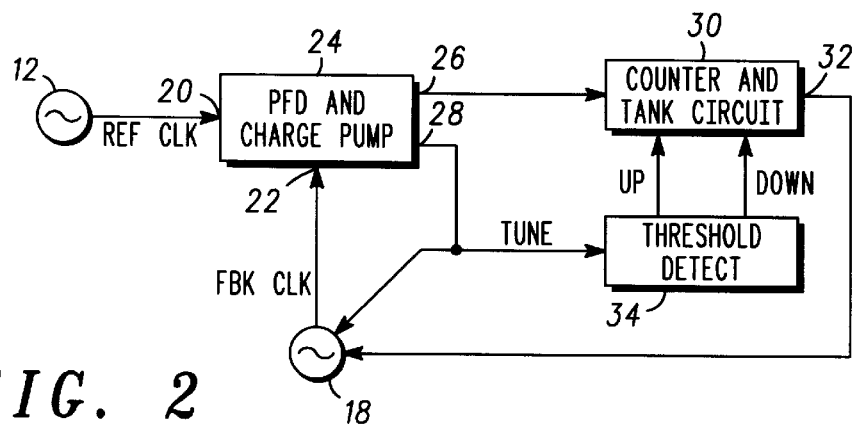
FIG. 2 is a block diagram of another embodiment of the phase-locked loop system of FIG. 1.

FIG. 2 is a block diagram of another embodiment of a phase correction circuit of PLL system 10. It should be noted that the same reference numbers are used in the figures to denote the same elements. In this embodiment, PLL system 10 includes a PFD/charge pump 24. PFD/charge pump 24 is a detector circuit that receives a reference clock signal REF CLK from an oscillator 12 and a feedback clock signal FBK CLK from an oscillator 18. PFD/charge pump 24 has an output terminal 28 that is commonly connected to an input terminal of a threshold detect circuit 34 and to a first input terminal of oscillator 18. For the sake of simplicity, the loop filter that filters the signal at the output of PFD/charge pump 24 is not shown. An output terminal 26 of PFD/charge pump 24 is connected to an input of counter and tank circuit block 30. Threshold detect circuit 34 has two output terminals for supplying the detect signals UP and DOWN to a counter and tank circuit block 30. An output terminal of counter and tank circuit block 30 is connected to a second input terminal of oscillator 18. A scalar circuit (not shown) may or may not be included for reducing the frequency of the signal generated by oscillator 18 when providing the signal FBK CLK.

Figure 3:
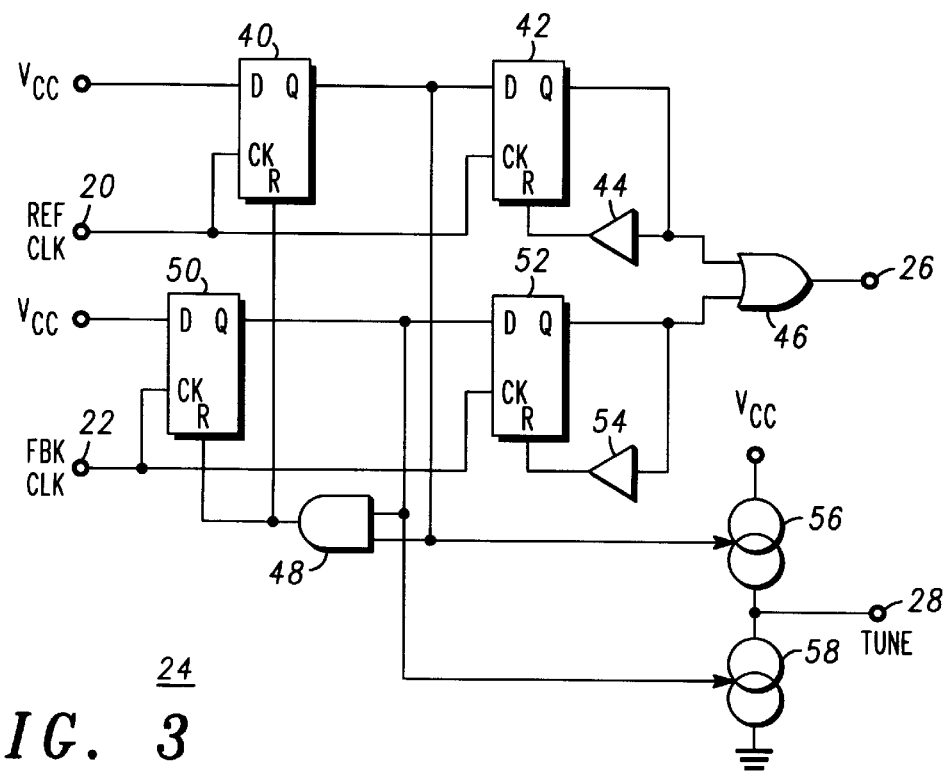
FIG. 3 is a schematic diagram of a phase and frequency detector and associated charge pump that are used in the phase-locked loop system of FIG. 2.

FIG. 3 is a schematic diagram of PFD/charge pump 24 of FIG. 2. PFD/charge pump 24 includes flip-flops 40, 42, 50, and 52 each having a data input D, a clock input CK, a clear or reset input R, and a data output Q. The clock inputs of flip-flops 40 and 42 are connected to an input terminal 20 for receiving the signal REF CLK while the clock inputs of flip-flops 50 and 52 are connected to an input terminal 22 for receiving the signal FBK CLK. The data inputs of flip-flops 40 and 50 are coupled for receiving a source of operating potential $V_{CC}$. The data output of flip-flop 40 is commonly connected to the data input of flip-flop 42, to a first input of a two input AND-gate 48, and to a control terminal of current source 56. The data output of flip-flop 50 is commonly connected to the data input of flip-flop 52, to the second input of AND-gate 48, and to a control terminal of current source 58.

Current source 56 has a first terminal connected to the operating potential $V_{CC}$ and a second terminal connected to terminal 28. Current source 58 has a first terminal connected to terminal 28 and a second terminal connected to the operating potential $V_{EE}$, shown in the figures as ground. The output of AND-gate 48 is commonly connected to the reset inputs of flip-flops 40 and 50. The data output of flip-flop 42 is commonly connected to a first input of a two input OR-gate 46 and to an input of a buffer 44. The output of buffer 44 is connected to the reset input of flip-flop 42. The data output of flip-flop 52 is commonly connected to the second input of OR-gate 46 and to an input of a buffer 54. The output of buffer 54 is connected to the reset input of flip-flop 52. The output of OR-gate 46 is connected to terminal 26.

The buffers 44 and 54 increase the signal conduction path and add time delays that cause the buffers to generate wider pulses. It should be understood that AND-gate 48 illustrates the desired AND function and could be implemented as a NAND-gate connected to an inverter (not shown in the figures). Likewise, OR-gate 46 is a logic gate that illustrates the desired OR function and could be implemented as a NOR-gate connected to an inverter (not shown in the figures).

Figure 4:
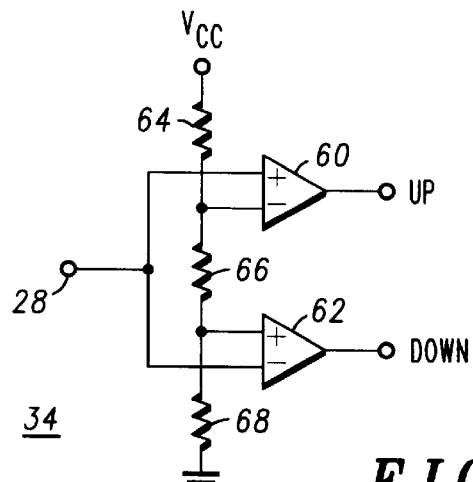
FIG. 4 is a schematic diagram of a threshold detect circuit of FIG. 2.

FIG. 4 is a schematic diagram of threshold detect circuit 34 of FIG. 2. Threshold detect circuit 34 includes serially connected resistors 64, 66, and 68 that are coupled between the operating potentials of $V_{CC}$ and $V_{EE}$. In particular, resistor 64 has a terminal connected to the operating potential $V_{CC}$ and resistor 68 has a terminal connected to the operating potential $V_{EE}$. An amplifier 60 has a non-inverting input terminal connected to terminal 28 and an inverting input terminal connected to the common connection of resistors 64 and 66 for receiving a voltage that is about two hundred millivolts below the operating potential $V_{CC}$. The output of amplifier 60 provides the signal UP. An amplifier 62 has an inverting input terminal connected to terminal 28 and a non-inverting input terminal connected to the common connection of resistors 66 and 68 for receiving a voltage that is about two hundred millivolts above the operating potential $V_{EE}$. The output of amplifier 62 provides the signal DOWN.

Figure 5:
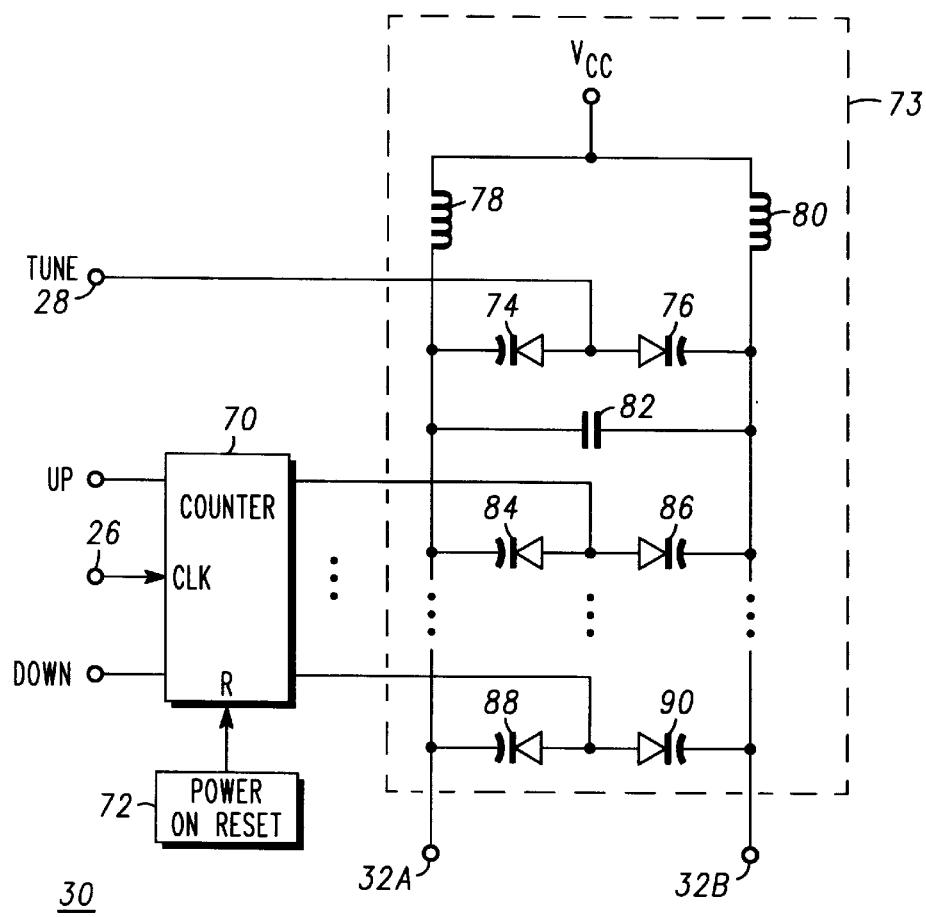
FIG. 5 is a schematic diagram of a frequency counter and tank circuit block of FIG. 2.

FIG. 5 is a schematic diagram of counter and tank circuit block 30 of FIG. 2. For convenience of describing the connections that exist between tank circuit 73 and counter 70, the counter and tank circuit are shown together in FIG. 5. However, tank circuit 73 is considered part of oscillator 18 (see FIG. 2). For instance, the signal TUNE is shown in FIG. 5 as an input of tank circuit 73, but is shown in FIG. 2 as an input of oscillator 18. This is consistent with tank circuit 73 being part of oscillator 18.

Counter and tank circuit block 30 includes an up/down counter 70 having input terminals for receiving the signals UP and DOWN from threshold detect circuit 34. Counter 70 has an additional input terminal R for receiving a reset signal when PLL system 10 is being initialized during a power-up sequence. The output terminals of counter 70 are connected to input terminals of a tank circuit 73. Although FIG. 5 shows a counter 70 having output signals that respond to either an UP signal or a DOWN signal, it should be noted that a counting circuit such as a shift register or a statemachine could be used in place of counter 70.

Tank circuit 73 includes a set of varactors 74 and 76, a fixed capacitor 82, and inductors 78 and 80 for course tuning the resonant frequency of the tank circuit. The anodes of varactors 74 and 76 are connected to each other and to terminal 28. The cathode of varactor 74 is connected to an output terminal 32A and the cathode of varactor 76 is connected to an output terminal 32B. The letters A and B have been appended to reference number 32 (see FIG. 2) to indicate the terminals for connecting cross coupled transistors (not shown) that form oscillator 18. Capacitor 82 is coupled between terminals 32A and 32B, and inductors 78 and 80 couple terminals 32A and 32B, respectively, to the operating potential $V_{CC}$.

Tank circuit 73 includes additional sets of varactors controlled by counter 70 for fine tuning the resonant frequency of the tank circuit. A first set of varactors includes varactors 84 and 86 having commonly connected anodes coupled to a control line received from counter 70. A second set of varactors includes varactors 88 and 90 have commonly connected anodes that are coupled to another control line received from counter 70. The cathodes of varactors 84 and 88 are connected to output terminal 32A and the cathodes of varactors 86 and 90 are connected to output terminal 32B. Although FIG. 5 shows counter 70 providing two lines for controlling two sets of varactors in tank circuit 73, additional control lines and additional sets of varactors can be included.

By way of example, the preferred embodiment for counter and tank circuit block 30 includes a four-bit counter 70 that generates four signals for controlling four sets of binary weighted varactors. The capacitance of the second, third, and fourth sets of binary weighted varactors is two times, four times, and eight times, respectively, the capacitance of the first set of varactors. Alternatively, the count of counter 70 could be decoded to provide $2^N$ signals for controlling $2^N$ sets of matched varactors, where N is an integer number.

Figure 6:
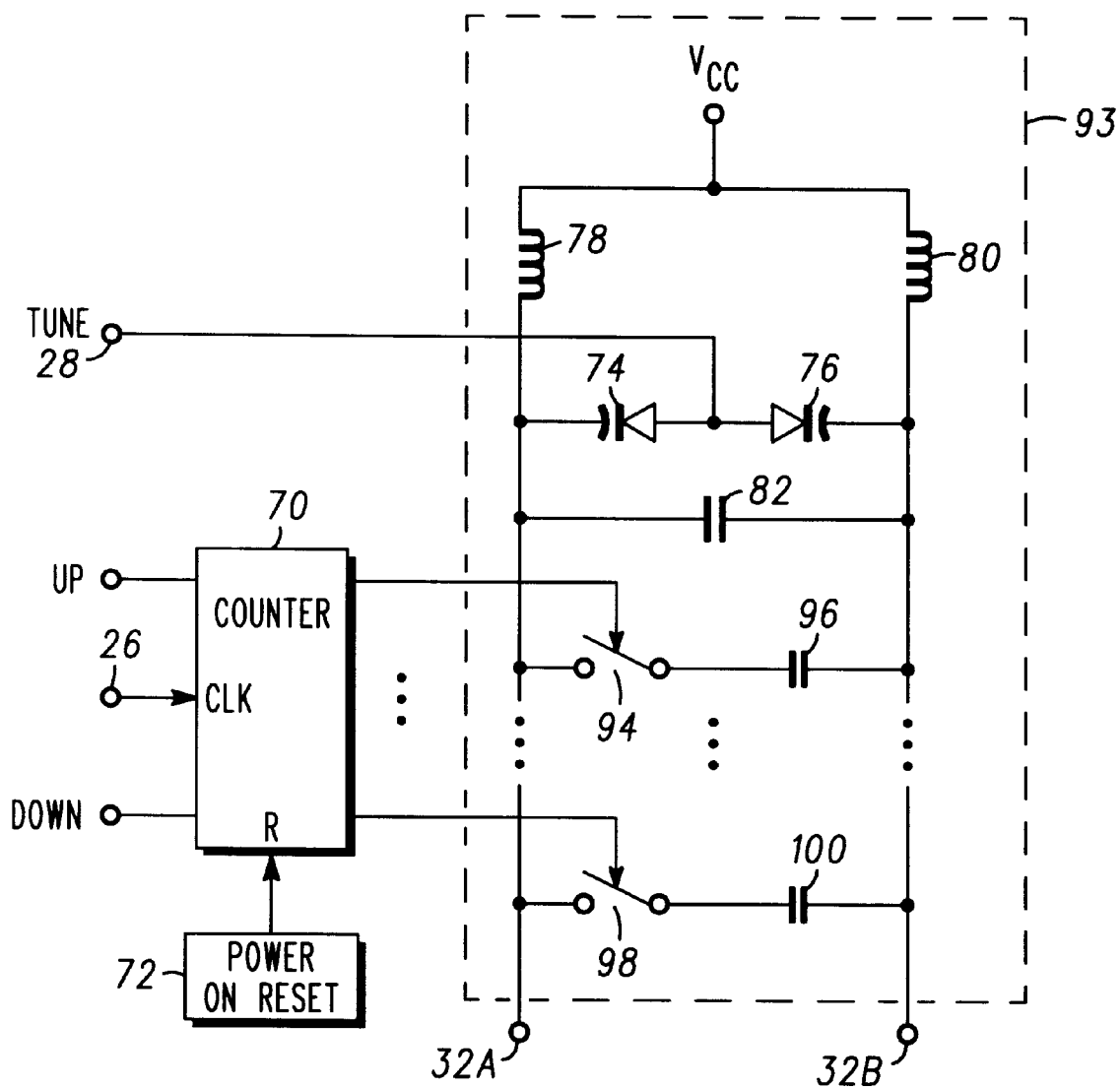
FIG. 6 is a schematic diagram of another embodiment of the frequency counter and tank circuit block of FIG. 2.

FIG. 6 is a schematic diagram of another embodiment of counter and tank circuit block 30 of FIG. 2. Again, for convenience of describing the connections that exist between tank circuit 93 and counter 70, the counter and tank circuit are shown together in FIG. 6. However, tank circuit 93 is considered part of oscillator 18 (see FIG. 2). Tank circuit 93 includes a fixed capacitor 96 in series with a switch 94, the capacitor/switch combination being connected across terminals 32A and 32B. Tank circuit 93 further includes a fixed capacitor 100 in series with a switch 98, the capacitor/switch combination also being connected across terminals 32A and 32B. Although FIG. 6 shows counter 70 providing two lines for controlling switches 94 and 98, the present invention can include any number of control lines and capacitor/switch combinations. It should be noted that switches 94, . . . , 98 are typically transistors having a base or gate terminal controlled by the output signals of counter 70.

In operation, briefly referring to FIG. 1, PLL system 10 includes PFD 14 that detects a phase difference between selected edges of the signal REF CLK and the signal FBK CLK. When PFD 14 detects that the signal FBK CLK generated by oscillator 18 has a frequency that is less than the frequency of the signal REF CLK, then the voltage of the analog signal generated by PFD 14 is increased. With frequency and phase mismatches between the signals REF CLK and FBK CLK, the analog signal increases until limited by the operating potential $V_{CC}$ of PFD 14. With the analog signal at the upper value, decision circuit and Digital-to-Analog Converter (DAC) 16 generate an offset voltage that is added to the output of PFD 14 by summing circuit 17 for increasing the operating potential of oscillator 18. By way of example, with the operating potential $V_{CC}$ at about 3 volts, incremental offset voltages can adjust the operating potential of oscillator 18 to about 5 volts. The offset voltage extends the tuning range of oscillator 18 and allows the PLL system 10 locking condition where FBK CLK and REF CLK match in frequency and phase.

The operation of the embodiment illustrated in FIGS. 2–5 is now described. This embodiment of PLL system 10 includes PFD/charge pump 24 for detecting the phase difference between selected edges of the signal REF CLK and the signal FBK CLK. Based on the detected phase difference, PFD/charge pump 24 generates an analog signal at terminal 28. By way of example, if the signal REF CLK leads the signal FBK CLK, then the analog value of the signal at terminal 28 is increased until the signal FBK CLK transitions. The signal REF CLK is said to be leading the signal FBK CLK when a selected transition of the signal REF CLK occurs before a selected transition of the signal FBK CLK. Thus, the signal at terminal 28 is increased during the time that the signal REF CLK leads the signal FBK CLK, i.e., the phase difference between the two signals. It should be pointed out that current sources 56 and 58 operate as a charge pump for generating charge that is placed on a node of a loop filter (not shown). The loop filter provides a Direct Current (DC) signal by filtering out the Alternating Current (AC) component of the charge pump signal, leaving only the DC component of the charge pump signal. The amplitude of the DC signal is adjusted in accordance with the phase difference between signals REF CLK and FBK CLK.

On the other hand, the signal REF CLK is said to be lagging the signal FBK CLK when a selected transition of the signal REF CLK occurs after a selected transition of the signal FBK CLK. By way of example, if the signal REF CLK lags the signal FBK CLK, then the analog value of the signal at terminal 28 is decreased until the signal REF CLK transitions. Thus, the signal at terminal 28 is decreased during the time that the signal REF CLK lags the signal FBK CLK, i.e., the phase difference between the two signals. AND-gate 48 detects that flip-flops 40 and 50 have both been set in response to the respective signals REF CLK and FBK CLK and causes both flip-flops to reset. After resetting, flip-flops 40 and 50 are set based on clock transitions of the signals FBK CLK and REF CLK and provide output signals that indicate whether the signal FBK CLK leads or lags the signal REF CLK.

PFD/charge pump 24 also provides an output signal at terminal 26 that indicates when the signals REF CLK and FBK CLK are not closely aligned. By way of example, when the signal REF CLK leads the signal FBK CLK and two low-to-high transitions of the signal REF CLK occur before a low-to-high transition of the signal FBK CLK, flip-flops 40 and 42 are set. When flip-flop 42 is set, a logic one pulse is provided at terminal 26. In addition, when the signal REF CLK lags the signal FBK CLK and two low-to-high transitions of the signal FBK CLK occur before a low-to-high transition of the signal REF CLK, flip-flops 50 and 52 are set. When flip-flop 52 is set, a logic one pulse is provided at terminal 26. A pulse supplied at terminal 26 indicates at least a 2 π (Pi) phase difference between the signals REF CLK and FBK CLK.

Referring to FIG. 4, the analog signal received by threshold detect circuit 34 from PFD/charge pump 24 is compared against an upper reference voltage by amplifier 60 and against a lower reference voltage by amplifier 62. The upper and lower reference voltages are set by resistors 64, 66, and 68. The upper reference voltage has a value that is less than $V_{CC}$ by several hundred millivolts and the lower reference voltage has a value that is greater than $V_{EE}$ (ground) by several hundred millivolts. When the analog signal received at terminal 28 has a value that is greater than the upper reference voltage, then amplifier 60 supplies a detect signal UP having a logic one value. When the analog signal received at terminal 28 has a value that is less than the lower reference voltage, then amplifier 62 supplies a detect signal DOWN having a logic one value. When the analog signal has a value that is between the upper reference voltage and the lower reference voltage, then amplifiers 60 and 62 supply UP and DOWN signals having logic zero values.

Referring to FIG. 5, the signals UP and DOWN are inputs of up/down counter 70. In the preferred embodiment counter 70 is a four bit counter that generates output values ranging from 0000 (zero) to 1111 (fifteen). Counter 70 is initialized by power-on-reset circuit 72 to a midrange value of either 0111 (seven) or 1000 (eight). When the signal UP is received, counter 70 increments the count value from the current count value to the next higher count value. When the signal DOWN is received, counter 70 decrements the count value from the current count value to the next lower count value. It should be pointed out that counter 70 is not immediately clocked when the signals UP and DOWN are received, but rather, counter 70 is incremented or decremented based on a delayed clock supplied by PFD/charge pump 24 at terminal 26 that prevents clocking on spurious UP and DOWN signals. Alternatively, it is further possible to clock counter 70 with an independent clock having a frequency that is greater than the lock time of PLL system 10.

The count value provided by counter 70 determines the number of varactor sets within tank circuit 73 that are biased either on or off. The four control lines supplied from counter 70 to tank circuit 73 in the preferred embodiment are used for controlling the four sets of binary weighted varactors. By way of example, when counter 70 generates a count value of 1111, varactors 84, 86, . . . , 88, and 90 are biased to provide the maximum capacitance across terminals 32A and 32B, i.e., the variable capacitance that is in parallel with the capacitance of fixed capacitor 82 is maximized. When counter 70 generates a count value of 0000, varactors 84, 86, . . . , 88, and 90 are biased to provide the minimum capacitance across terminals 32A and 32B, i.e., the variable capacitance that is in parallel with the capacitance of fixed capacitor 82 is minimized.

The frequency at which tank circuit 73 resonates is set by the count value provided by counter 70 that controls the capacitance of varactors 84, 86, . . . , 88, and 90, the analog value of the signal TUNE that controls the capacitance of varactors 74 and 76, the fixed capacitance of capacitor 82, and the inductance of inductors 78 and 80. PLL system 10 dynamically adjusts the phase and frequency of the signal FBK CLK to match that of the signal REF CLK. By initializing counter 70 at its midrange, tank circuit 73 is initialized to a nominal frequency that can either be increased by decrementing counter 70 or decreased by incrementing counter 70.

Referring to FIG. 6, capacitors 96, . . . , 100 replace the varactors 84–90 of FIG. 5. In this embodiment, the capacitances from fixed capacitors 96, . . . , 100 are switched in and out of tank circuit 93 for setting the resonate frequency. Capacitors 96, . . . , 100 can either have matched capacitance values or binary weighted values. Counter 70 provides the control lines to switches 94, . . . , 98 for switching capacitors 96, . . . , 100 in and out of the tank circuit.

By now it should be appreciated that the present invention provides a circuit and method for self calibrating a VCO and extending the tuning range of a PLL system. An analog signal generated by the phase detector is detected above an upper limit or below a lower limit and either an offset voltage is added to the VCO or the capacitance in a tank circuit is adjusted.

What is claimed is:

1. A correction circuit, comprising a detector circuit that includes:

first and second latches having commonly coupled clock terminals for receiving the first input signal, where an input of the first latch is coupled to a first conductor terminal for receiving a first operating potential and an output of the first latch is coupled to an input of the second latch;

third and fourth latches having commonly coupled clock terminals for receiving the second input signal, where an input of the third latch is coupled to the first conductor terminal for receiving the first operating potential and an output of the third latch is coupled to an input of the fourth latch;

a logic gate having a first input coupled to an output of the second latch, a second input coupled to an output of the fourth latch, and an output that provides the output signal; and first and second current sources serially connected between the first conductor terminal and a second conductor terminal, where the first current source has a control terminal coupled to the output of the first latch, the second current source has a control terminal coupled to the output of the third latch, and an output of the first and second current sources supplies an analog signal.

2. The correction circuit of claim 1, further comprising a threshold detect circuit having an input coupled for receiving the analog signal and generating a first detect signal when the analog signal has a value greater than a first reference voltage.

3. The correction circuit of claim 2, wherein the threshold detect circuit further generates a second detect signal when the analog signal has a value less than a second reference voltage.

4. The correction circuit of claim 3, further comprising a counting circuit having first and second input terminals coupled for receiving the first and second detect signals, a clock input terminal coupled for receiving the output signal from the detector circuit, and output terminals that provide count signals.

5. The correction circuit of claim 4, further comprising a tank circuit having first and second varactors with commonly coupled anodes for receiving one of the count signals from the counting circuit and cathodes of the first and second varactors are coupled to respective first and second terminals.

6. The tank circuit of claim 5, further comprising third and fourth varactors having commonly coupled anodes coupled for receiving the analog signal from the detector circuit and cathodes coupled to the first and second terminals.

7. The correction circuit of claim 4, further comprising a tank circuit having a switch and capacitor serially coupled across first and second terminals, where a control terminal of the switch is coupled to one of the output terminals of the counting circuit.

8. The tank circuit of claim 7, further comprising another switch and capacitor serially coupled across the first and second terminals, where a control terminal of the another switch is coupled for receiving a signal from the counting circuit.

9. The correction circuit of claim 4, further comprising:

an Digital-to-Analog Converter that converts the output signals generated by the counting circuit to an offset voltage;

a summing circuit having a first input coupled for receiving the offset voltage and a second input coupled to the detector circuit for receiving the analog signal and generating a summed signal; and an oscillator that receives the summed signal as an operating potential for improving a tuning range of the oscillator.

10. A correction circuit, comprising:

a detector circuit having inputs for receiving first and second signals, a first output for providing an analog signal that changes value upon receiving a first transition of the first signal and stops changing when a first transition of the second signal is received, and an output for providing an output signal when another first transition of the first signal occurs before another first transition of the second signal;

a threshold detect circuit having an input coupled for receiving the analog signal and generating a detect signal when the analog signal has a value greater than a first reference voltage;

a counting circuit having a first input coupled for receiving the detect signal, a second input coupled for receiving the output signal from the detector circuit, and an output for providing count signals; and a Digital-to-Analog Converter (DAC) that converts the count signals to an offset voltage.

11. The correction circuit of claim 10, further comprising an oscillator having a tank circuit that sets a resonant frequency based on receiving the count signals and the analog signal.

12. The correction circuit of claim 10, further comprising:

a summing circuit having a first input coupled for receiving the offset voltage and a second input coupled to the detector circuit for receiving the analog signal and generating a summed signal; and an oscillator that receives the summed signal as an operating potential for improving a tuning range of the oscillator.

13. A method of providing phase correction by extending a tuning range of a phase lock loop, comprising the steps of:

increasing a value of an analog signal upon detection of a first transition of a first signal until a first transition of a second signal is detected or decreasing the value of the analog signal upon detection of a first transition of the second signal until the transition of the first signal is detected;

generating a clock signal when another first transition of the first signal is received before another transition of the second signal;

comparing the analog signal against an upper and lower reference voltage to detect when a tuning range of an oscillator is limited; and adjusting a resonant frequency of an oscillator when the clock signal is received and the tuning range is limited.

14. The method of claim 13, further including the step of using the clock signal for changing a count value that controls a capacitance value when adjusting the resonant frequency of the oscillator.

15. The method of claim 13, further including the step of using the clock signal for generating an offset voltage that raises an operating voltage and extends the tuning range of the oscillator.

* * * * *